United States Patent [19]

Kobayashi et al.

[11] Patent Number: 5,688,701
[45] Date of Patent: Nov. 18, 1997

[54] METHOD OF MAKING SEMICONDUCTOR DEVICE HAVING A PLURALITY OF IMPURITY LAYERS

[75] Inventors: Maiko Kobayashi; Takashi Kuroi, both of Hyogo, Japan

[73] Assignee: Mitsubishi Denki Kabushiki Kaisha, Tokyo, Japan

[21] Appl. No.: 657,251

[22] Filed: Jun. 3, 1996

Related U.S. Application Data

[62] Division of Ser. No. 339,200, Nov. 10, 1994, Pat. No. 5,543,647.

[30] Foreign Application Priority Data

Nov. 16, 1993 [JP] Japan .................. 5-286884

[51] Int. Cl.⁶ .................................. H01L 21/265
[52] U.S. Cl. .................. 437/29; 437/34; 437/35; 437/45; 437/56; 437/69
[58] Field of Search .................. 437/29, 34, 35, 437/45, 57, 58, 69, 56

[56] References Cited

U.S. PATENT DOCUMENTS

| | | | |
|---|---|---|---|
| 4,710,477 | 12/1987 | Chen | 437/34 |
| 4,717,683 | 1/1988 | Parrillo et al. | 437/34 |
| 4,784,968 | 11/1988 | Komori et al. | 437/41 |
| 5,141,882 | 8/1992 | Komori et al. | |
| 5,142,882 | 9/1992 | Komori et al. | 437/34 |
| 5,344,787 | 9/1994 | Nagalingam | 437/35 |
| 5,432,107 | 7/1995 | Uno et al. | 437/35 |
| 5,518,943 | 5/1996 | Tsunoda | 437/45 |
| 5,543,647 | 8/1996 | Kobayashi et al. | 257/345 |
| 5,554,883 | 9/1996 | Kuroi | 257/617 |

FOREIGN PATENT DOCUMENTS

| | | | |
|---|---|---|---|
| 0103445 | 8/1981 | Japan | 437/29 |
| 62-54466 | 3/1987 | Japan . | |
| 4-290471 | 10/1992 | Japan . | |

OTHER PUBLICATIONS

"A 0.5UM Isolation Technology Using Advanced Poly Silicon Pad Locos (Appl)", Toshiyuki Nishihara et al., IEDM 1988, pp. 100–103.

Primary Examiner—Jey Tsai
Assistant Examiner—Long Pham
Attorney, Agent, or Firm—Lowe, Price, LeBlanc & Becker

[57] ABSTRACT

A semiconductor device in which ability for isolating elements from each other can be improved and increase in substrate constant and junction capacitance can be suppressed, is disclosed. An impurity layer for improving the ability for isolating elements is positioned only immediately below an isolating insulating film. An impurity layer for adjusting substrate constant and junction capacitance is formed through independent steps from the impurity layer for improving the isolating ability.

8 Claims, 12 Drawing Sheets

DEPTH FROM LOWER SURFACE OF ISOLATING INSULATING FILM (μm)

DEPTH FROM MAIN SURFACE OF SUBSTRATE (μm)

METHOD OF MAKING SEMICONDUCTOR DEVICE HAVING A PLURALITY OF IMPURITY LAYERS

This application is a division of application Ser. No. 08/339,200 filed Nov. 10, 1994 now U.S. Pat. No. 5,543,647.

BACKGROUND OF THE INVENTION

1. Field of the Invention

The present invention relates to a semiconductor device in which a plurality of impurity layers are formed in a semiconductor substrate by ion implantation, and to a manufacturing method thereof.

2. Description of the Background Art

A main surface of a semiconductor substrate is classified into element forming regions and element isolating regions. In an element forming region, an element such a MOS transistor is formed. An element isolating region has an isolating insulating film formed to surround the element forming region for electrically isolating adjacent element forming regions from each other.

FIG. 15 is an illustration of an MOS type semiconductor device viewed from above, and FIGS. 16 and 17 are cross sections taken along the lines E–E' and F–F' of FIG. 15, respectively.

As shown in the figure, the main surface of a semiconductor substrate 1 formed of single crystal of silicon, for example, includes an element forming region 2 and an element isolating region 3 surrounding element forming region 2. In element isolating region 3, an isolating insulating film 4 for electrically isolating adjacent element forming regions 2 from each other is formed. Isolating insulating film 4 is an oxide film formed, for example, by thermal oxidation.

A gate electrode layer 5 formed of polycrystalline silicon, for example, extends over element forming region 2 and element isolating region 3. As shown in FIG. 15, element forming region 2 has a source region 6 and a drain region 7 of the MOS transistor on one side and on the other side of gate electrode layer 5, respectively.

As shown in FIGS. 16 and 17, a first impurity layer 8 is formed near the main surface of element forming region 2, a second impurity layer 9 is formed at a position deeper than that, and a third impurity layer 10 is formed at a position still deeper than that. The second and third impurity layers 9 and 10 are formed entirely in a direction parallel to the surface of semiconductor substrate 1. The first, second and third impurity layers 8, 9 and 10 are formed by the same conductivity type impurity as that of substrate 1.

When a p channel MOS transistor is to be formed, source region 6 and drain region 7 are formed by implanting, for example, boron to the main surface of element forming region 2. When an n channel MOS transistor is to be formed, source region 6 and drain region 7 are formed by implanting phosphorus or arsenic to the main surface of element forming region 2.

FIG. 18 shows a distribution curve of impurity concentration viewed along the line G–G' of FIG. 16, while FIG. 19 shows a distribution curve of impurity concentration viewed along the line X–X' of FIG. 16.

First impurity layer 8 is formed for adjusting threshold voltage of the transistor, and peak impurity concentration thereof is positioned at a depth of at most 0.2 μm from the main surface of element forming region 2.

The function of second impurity layer 9 positioned below isolating insulating film 4 differs from the function of the same positioned below element forming region 2. Namely, that region of the second impurity layer 9 which is positioned below isolating insulating film 4 is to enhance ability of element isolation. More specifically, it serves to increase threshold voltage of a parasitic field transistor to suppress punch through between elements. The function of that region of the second impurity layer 9 which is positioned below element forming region 2 is to adjust substrate constant and junction capacitance. More specifically, it serves to eliminate lower concentration portion of the well to suppress punch through of the transistor.

The peak impurity concentration of that region of second impurity layer 9 which is positioned below isolating insulating film 4 is within the depth range of at most 0.1 μm from the lower surface of the isolating insulating film, while the peak impurity concentration of that region of second impurity layer 9 which is positioned below element forming region is within a depth range of from 0.4 μm to 0.5 μm from the main surface of the substrate.

The function of the third impurity layer 10 is to lower well resistance. More specifically, when CMOS circuit is formed at the element forming region 2, it increases latch up resistance. When a memory cell is formed in the element forming region, it increases soft error resistance. Further, it suppresses diffusion component of leak current. Below isolating insulating film 4, the third impurity layer 10 has peak impurity concentration within the depth range from 0.7 μm to 1.0 μm from the lower surface of the isolating insulating film, and below element forming region 2, it has peak impurity concentration within depth range from 1.1 μm to 1.4 μm from the main surface of the substrate.

Among impurity concentrations of the first, second and third impurity layers 8, 9 and 10, the peak value of second impurity layer 9 is the smallest.

Conventionally, the first, second and third impurity layers 10 have been formed in the following manner. First, by ion implantation of impurity to the entire main surface of semiconductor substrate 1 on which isolating insulating film 4 has been formed, second and third impurity layers 9 and 10 are formed. The depth of the impurity layer formed by ion implantation through the main surface of element forming region 2 comes to be different from the depth of the impurity layer formed by ion implantation through the thick isolating insulating film 4. As shown in FIGS. 16 and 17, the second and third impurity layers 9 and 10 are formed to be deep below element forming region 2 and shallow below isolating insulating film 4. After the formation of the second and third impurity layers 9 and 10, by ion implantation of impurity to the entire main surface of semiconductor substrate 1, first impurity layer 8 is formed near the main surface of semiconductor substrate 1. At this time, since the energy of ion implantation for forming the first impurity layer is small, an impurity layer is not formed in the element isolating region.

The conventional semiconductor device such as described above suffers from the following problems. Second impurity layer 9 has different functions at a region positioned below element forming region 2 and at a region positioned below element isolating region 3. The region of the second impurity layer 9 positioned below isolating insulating film 4 has a function of increasing ability to isolate elements, while the region below element forming region 2 has a function of adjusting substrate constant and junction capacitance.

As the degree of integration of the semiconductor device has been increased, higher ability of isolation has been required of the element isolating region. In order to improve the ability of isolating elements, it is necessary to increase impurity concentration of the second impurity layer 9 positioned below isolating insulating film 4. The peak value of impurity concentration of second impurity layer 9 in the region below element forming region 2 is not different from that in the region below element isolating region 3. Therefore, in order to improve ability of isolation, it is necessary to increase impurity concentration of the whole region of second impurity layer 9. When the second impurity layer 9 positioned below element forming region 2 comes to have higher impurity concentration, it means that impurity concentration of the element forming region as a whole is increased. This results in larger substrate constant, and larger fluctuation of the threshold voltage when a bias voltage is applied to the substrate. When the threshold voltage becomes higher, drain current becomes smaller and the difference between operational voltage applied to the gate and threshold voltage becomes smaller, which affects speed of response of the circuit.

Further, junction capacitance formed between the substrate and impurity layers of high concentration forming source and drain regions 6 and 7 increases as the impurity concentration of the substrate becomes higher. Therefore, if the impurity concentration of second impurity layer 9 is increased, the junction capacitance increases as well, affecting the speed of response of the circuit.

In order to suppress increase of substrate constant and of the junction capacitance, the impurity concentration of second impurity layer 9 positioned below element forming region 2 should be decreased, and the peak impurity concentration should be positioned deeper. However, if these conditions are satisfied, the ability of isolating elements of second impurity layer 9 positioned below isolating insulating film 4 would be degraded.

In the conventional semiconductor device, if the ability of isolation between elements is to be improved, operational characteristics of the elements such as transistors are degraded, while if the operational characteristics of the elements are to be improved, ability of isolation between elements is degraded.

SUMMARY OF THE INVENTION

An object of the present invention is to provide a semiconductor device which can improve both the ability of isolation between elements and operational characteristics of the elements.

Another object of the present invention is to provide a method of manufacturing a semiconductor device which reduces substrate constant and junction capacitance, and has sufficient ability of isolating elements from each other.

The semiconductor device in accordance with the present invention includes: a semiconductor substrate having a main surface which is classified into an element forming region and an element isolating region, an isolating insulating film formed in the element isolating region surrounding the element forming region; a first impurity layer; a second impurity layer; a third impurity layer; and a fourth impurity layer. The first impurity layer has peak impurity concentration at a position of a first depth from the main surface of the element forming region. The second impurity layer has peak impurity concentration at a position of a second depth from a lower surface of the isolating insulating film, and its expansion in a direction parallel to the substrate surface terminates near a position immediately below a boundary between the element forming region and the element isolating region. The third impurity layer has peak impurity concentration at a position of a third depth which is deeper than the first depth, from the main surface of the element forming region. The fourth impurity layer has peak impurity concentration at a position of a fourth depth which is deeper than the third depth, from the main surface of the element forming region.

The first impurity layer is formed to adjust threshold voltage of a transistor. The second impurity layer is formed to improve ability of isolating elements from each other. The third impurity layer is formed to adjust substrate constant and junction capacitance. The fourth impurity layer is formed to lower well resistance.

According to the present invention, the second impurity is positioned only below the isolating insulating film. Therefore, even when the concentration of the second impurity layer is increased in order to improve the ability of isolation, it does not affect the operational characteristics of the elements. Further, since the second and third impurity layers are formed separate from each other, the ability of isolation between elements can be improved while increase in substrate constant and junction capacitance can be suppressed.

According to the present invention, respective impurity layers can be formed to have optimal distribution of impurity concentrations independent from each other. Desirably, among the first, second, third and fourth impurity layers, the third impurity layer is formed to have the lowest peak value of impurity concentration.

In one embodiment, the first depth is at most 0.2 µm, the second depth is at most 0.1 µm, the third depth is within the range of 0.7 µm to 0.8 µm, and the fourth depth is within the range of 1.4 µm to 1.7 µm.

In one embodiment, the third and fourth impurity layers extend to a region positioned below the second impurity layer. The third impurity layer has peak impurity concentration at a position of a fifth depth which is deeper than the second depth, from the lower surface of the isolating insulating film. The fourth impurity layer has peak impurity concentration at a position of a sixth depth which is deeper than the fifth depth, from the lower surface of the isolating insulating film. The fifth depth is within the range of 0.3 µm to 0.4 µm, for example, and the sixth depth is within the range of 1.0 µm to 1.3 µm, for example.

Desirably, the first, second, third and fourth impurity layers are of the same conductivity type.

According to another aspect of the present invention, the semiconductor device further includes a fifth impurity layer near a portion immediately below the boundary between the element forming region and the element isolating region which position is overlapping the terminating portion of the second impurity layer. The fifth impurity layer is to improve the ability of isolation between elements, and preferably it extends diagonally toward the main surface of the element forming region.

The method of manufacturing a semiconductor device in accordance with the present invention includes the steps of: forming an isolating insulating film or isolating elements from each other on a main surface of a semiconductor substrate; forming a mask layer for preventing passage of an impurity at a main surface of an element forming region surrounded by the isolating insulating film; forming a first impurity layer immediately below the isolating insulating film only, by ion implanting an impurity through the isolating insulating film on the main surface of the semiconductor substrate provided with the mask layer; and forming a second impurity layer at a position deeper than the first impurity layer by ion implantation, after removal of mask layer, of an impurity through the main surface of the element forming region and through the isolating insulating film.

The first impurity layer is to improve ability of isolation between elements, and the second impurity layer is to adjust substrate constant and junction capacitance. According to the method of the present invention, since the first and second impurity layers are formed through separate steps, the ability of isolation between elements can be improved, while increase in substrate constant and in junction capacitance can be suppressed.

In a method in accordance with another aspect of the present invention, by oblique ion implantation of an impurity to the main surface of the semiconductor substrate with the mask layer left thereon, a third impurity layer which is partially overlapped with a terminating portion of the first impurity layer and extending obliquely toward the main surface of the element forming region is formed. The third impurity layer is to improve the ability of isolation between elements.

In a method in accordance with a further aspect of the present invention, the isolating insulating film is an oxide film formed by thermal oxidation. Prior to the formation of the isolating insulating film, an antioxidant film formed to cover the main surface of the element forming region is used as a mask layer for forming the first impurity layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
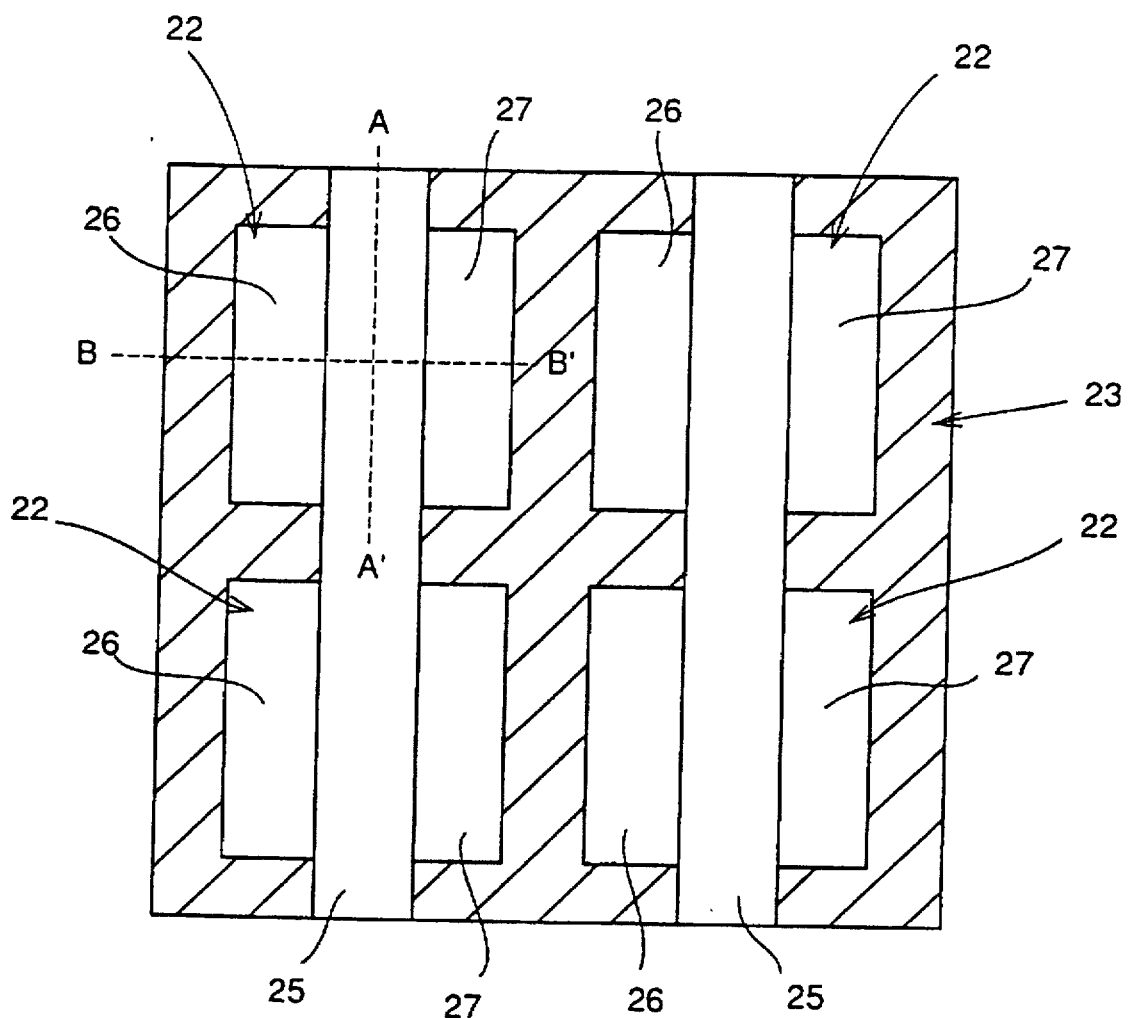
FIG. 1 is a plan view of a semiconductor device in accordance with the present invention.
Figure 2:
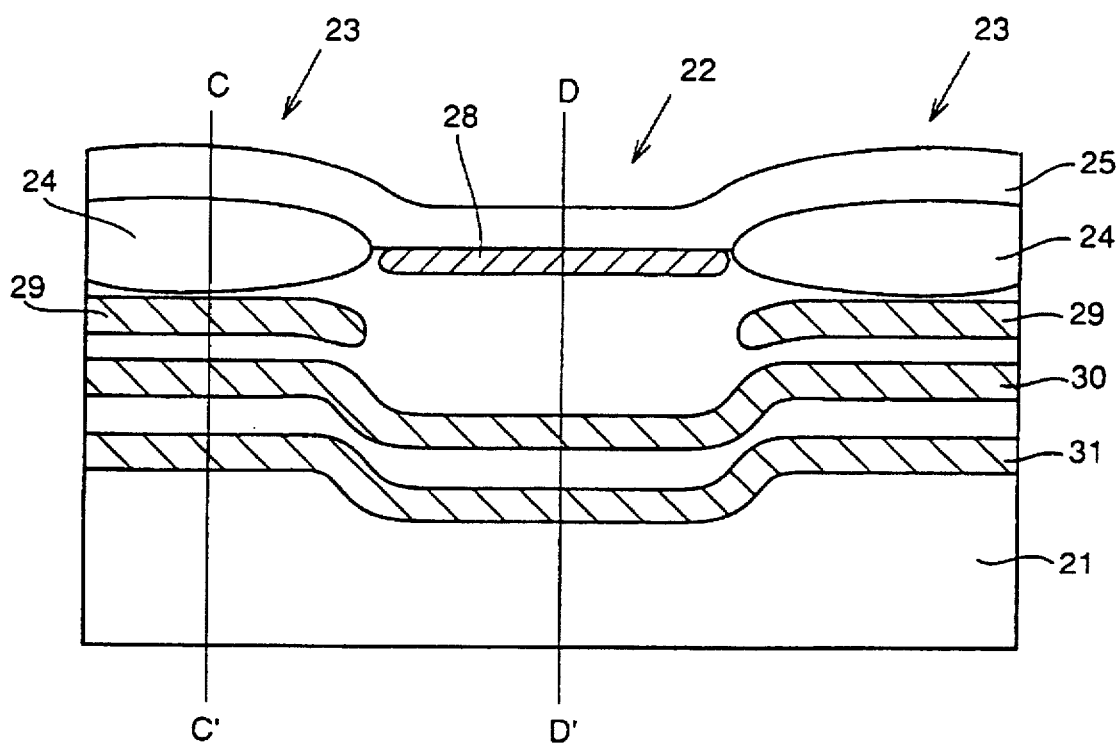
FIG. 2 is a cross section taken along the line A–A' of FIG. 1.
Figure 3:
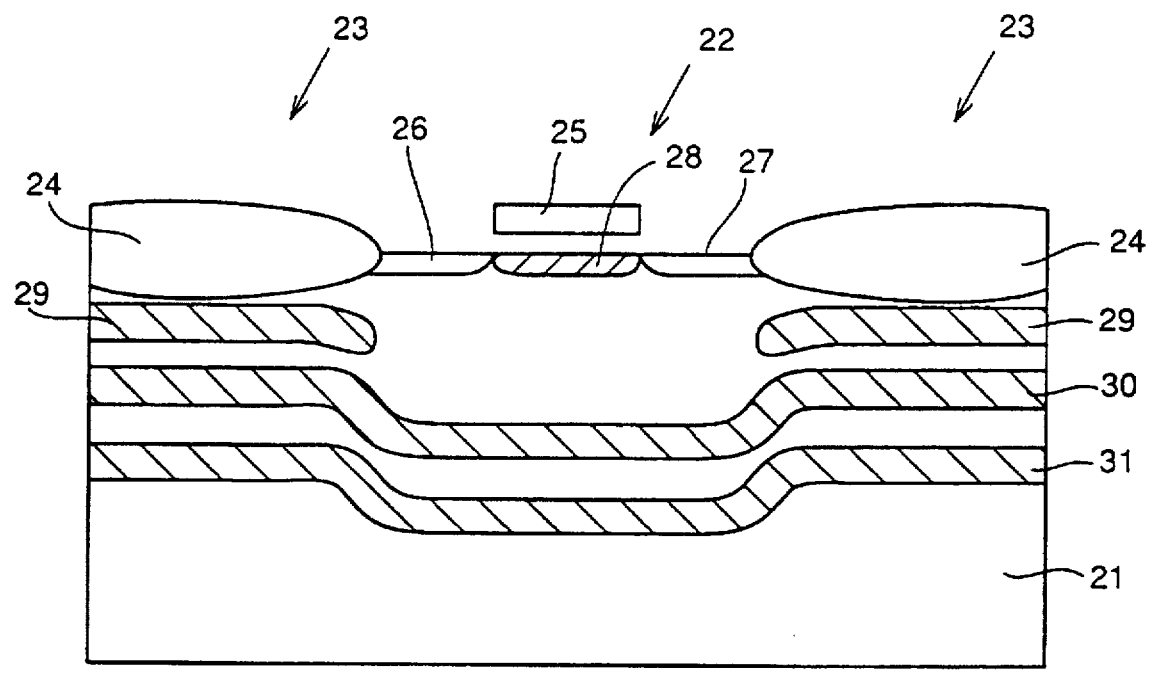
FIG. 3 is a cross section taken along the line B–B' of FIG. 1.

As shown in FIGS. 1 to 3, a main surface of a semiconductor substrate 21 is classified into an element forming region 22 and an element isolating region 23. Element isolating region 23 has an isolating insulating film 24 of an oxide film formed, for example, by thermal oxidation.

A gate electrode layer 25 of polycrystalline silicon, for example, extends over both element forming region 22 and element isolating region 23. Element forming region 22 has a source region 26 and a drain region 27 on one side and on the other side of gate electrode layer 25, respectively. In a p channel MOS transistor, source region 26 and drain region 27 are formed by ion implantation of boron, for example, and in an n channel MOS transistor, source region 26 and drain region 27 are formed by ion implantation of phosphorus, arsenic or the like.

Figure 4:
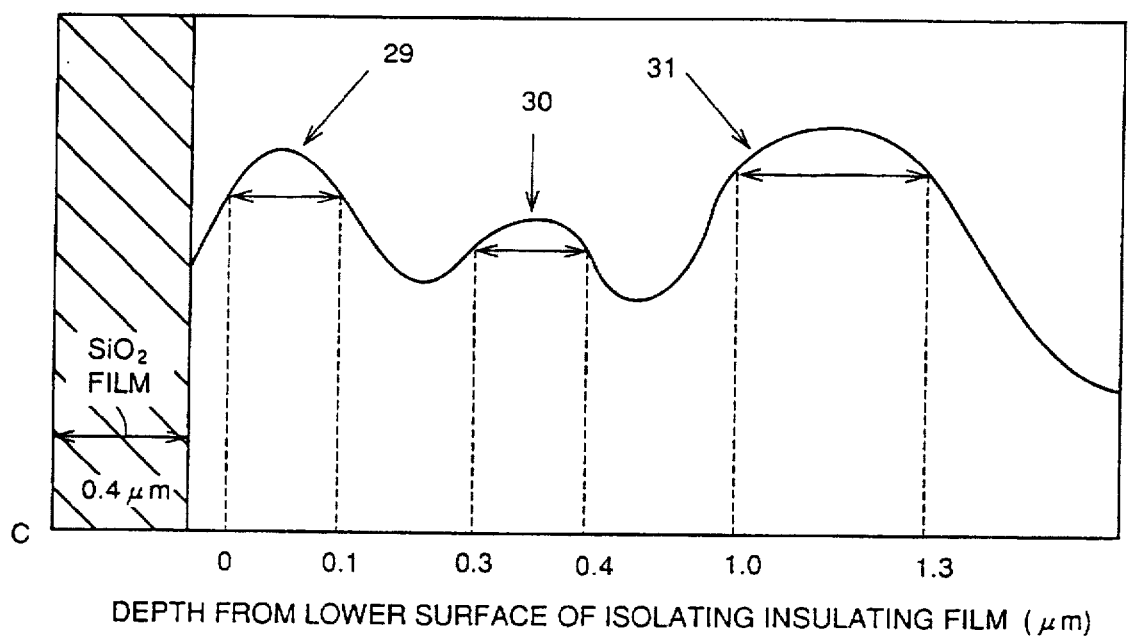
FIG. 4 shows a distribution curve of impurity concentration viewed along the line C–C' of FIG. 2.
Figure 5:
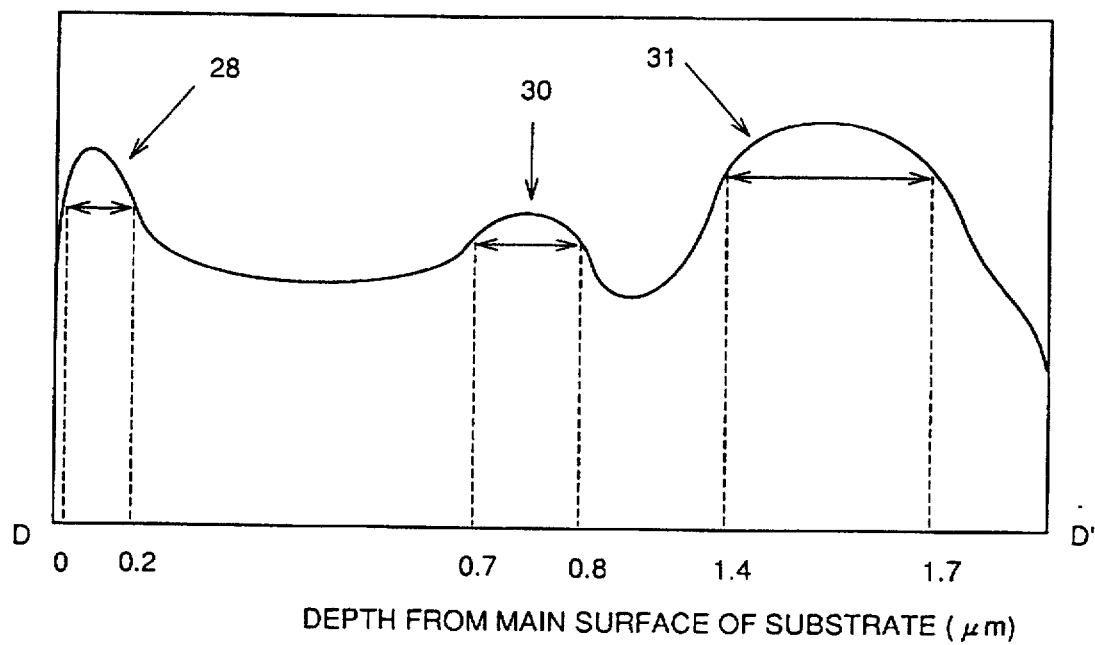
FIG. 5 shows distribution curve of impurity concentration viewed along the line D–D' of FIG. 2.

The semiconductor device shown includes a first impurity layer 28, a second impurity layer 29, a third impurity layer 30 and a fourth impurity layer 31 which are of the same conductivity type as semiconductor substrate 21. FIGS. 4 and 5 show distribution curves of impurity concentration of respective impurity layers.

First impurity layer 28 has peak impurity concentration at a position of a first depth from the main surface of element forming region 22. In this embodiment, the first depth is at most 0.2 μm. First impurity layer 28 is formed to adjust threshold voltage of the transistor.

Second impurity layer 28 has peak impurity concentration at a position of a second depth from the lower surface of isolating insulating film 24, and its expansion in a direction parallel to the substrate terminates near a position immediately below a boundary between element forming region 22 and element isolating region 23. In this embodiment, the second depth is within the range of up to 0.1 μm. The second impurity layer 29 is positioned only immediately below isolating insulating film 24, and its function is to improve ability of isolation between elements. More specifically, it increases threshold voltage of a parasitic field transistor, and suppresses punch through between elements.

Third impurity layer 30 has peak impurity concentration at a position of a third depth which is deeper than the first depth from the main surface of element forming region 22. In this embodiment, the third depth is within the range of 0.7 μm to 0.8 μm. The function of third impurity layer 30 is to adjust substrate constant and junction capacitance. More specifically, it eliminates low concentration portion in a well, and suppresses punch through of the transistor.

In the embodiment shown, third impurity layer 30 extends to a region positioned below second impurity layer 29. Third impurity layer 30 has peak impurity concentration at a position of a fifth depth which is deeper than the second depth from the lower surface of isolating insulating film 24. In this embodiment, the fifth depth is within the range of 0.3 μm to 0.4 μm.

Fourth impurity layer 31 has peak impurity concentration at a position of a fourth depth which is deeper than the third depth from the main surface of element forming region 22. In this embodiment, the fourth depth is within the range of 1.4 µm to 1.7 µm. The function of the fourth impurity layer 31 is to lower well resistance. More specifically, when a CMOS circuit is formed in the element forming region, it increases latch up resistance. When a memory cell is formed in the element forming region, it increases soft error resistance. Further, it suppresses diffusion component of leak current.

In the embodiment shown, the fourth impurity layer 31 extends to a region positioned below second impurity layer 29. Fourth impurity layer has peak impurity concentration at a position of a sixth depth which is deeper than said fifth depth from the lower surface of isolating insulating film 24. In this embodiment, the sixth depth is within the range of 1.0 µm to 1.3 µm.

The four impurity layers 28, 29, 30 and 31 are of the same conductivity type as semiconductor substrate 21. When an n channel MOS transistor is to be formed in element forming region 22, four impurity layers 28, 29, 30 and 31 are formed by ion implantation of a p type impurity, for example, boron. When a p channel MOS transistor is to be formed in element forming region 22, four impurity layers 28, 29, 30 and 31 are formed by ion implantation of an n type impurity, for example, phosphorus or arsenic.

Four impurity layers 28, 29, 30 and 31 are formed to have optimal impurity concentration distributions so that these layers properly fulfill their intended functions. Among four impurity layers 28, 29, 30 and 31, the peak value of impurity concentration of third impurity layer 30 is the lowest.

Figure 6:
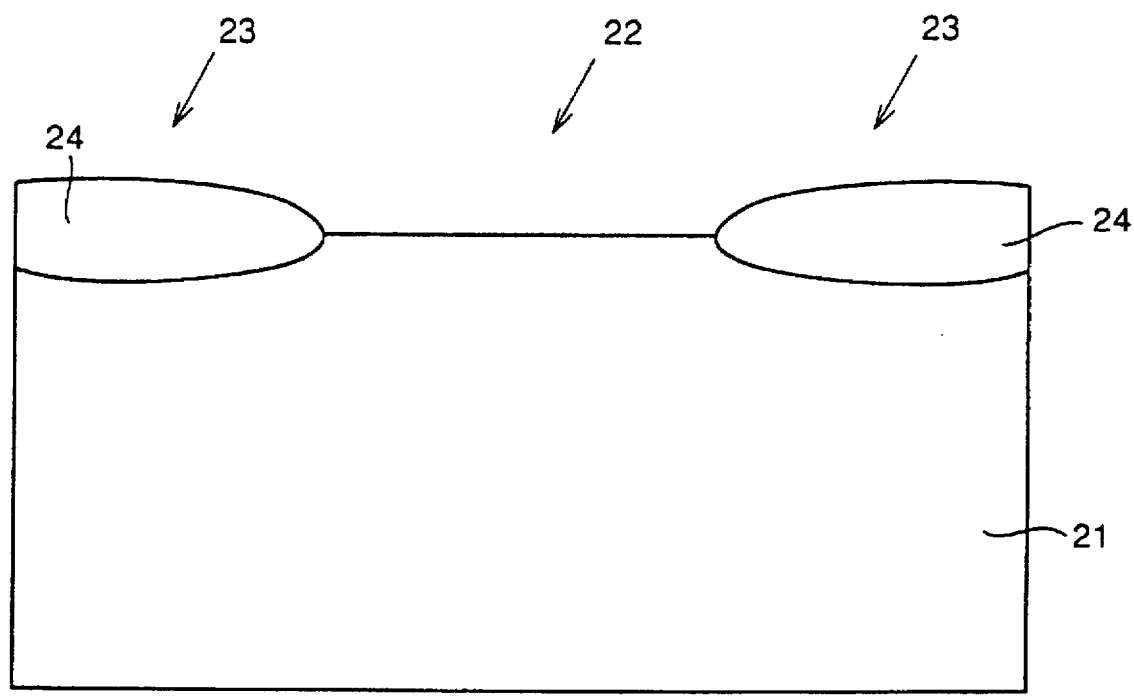
FIG. 6 is a cross section of a semiconductor substrate having an isolating insulating film.
Figure 7:
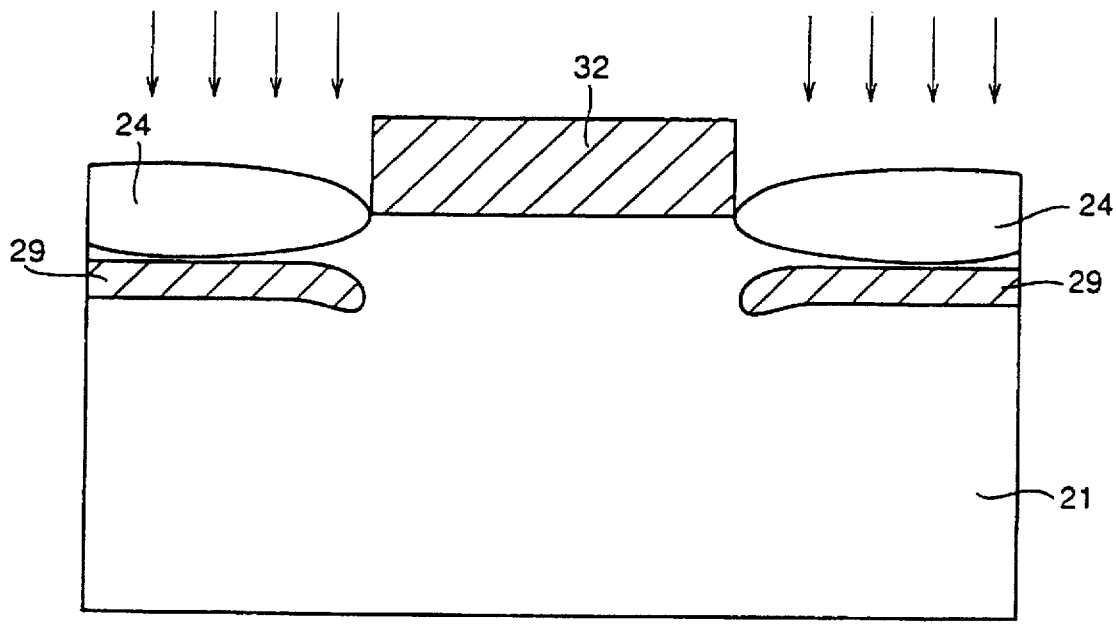
FIG. 7 is a cross section of a semiconductor substrate having an impurity layer immediately below the isolating insulating film only.
Figure 8:
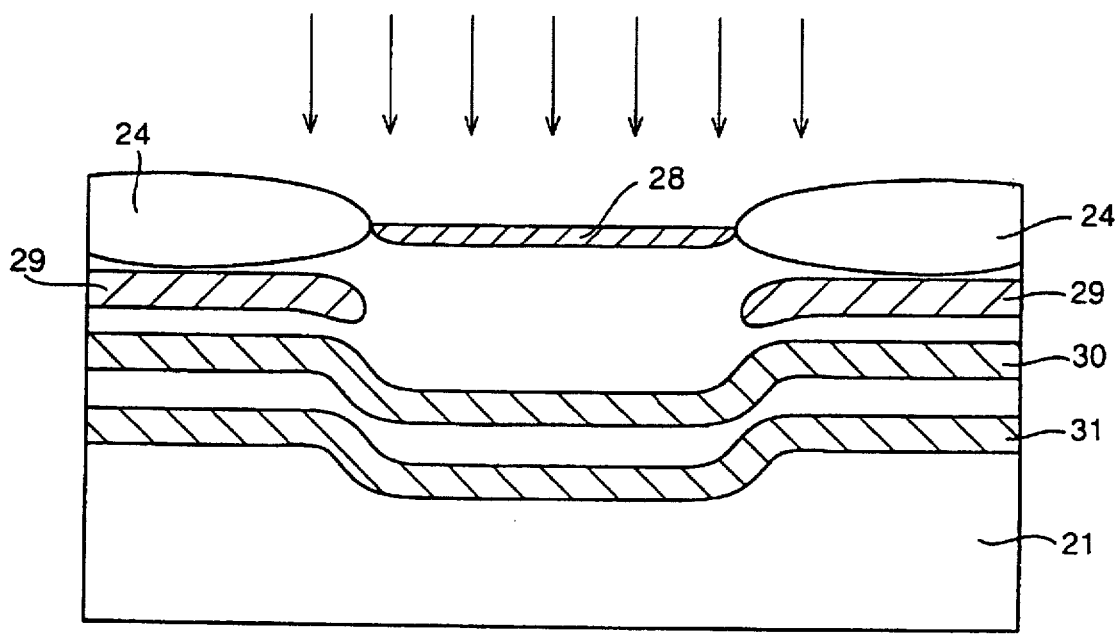
FIG. 8 is a cross section of a semiconductor substrate having first, second, third and fourth impurity layers.

FIGS. 6 to 8 show, in order, steps of manufacturing one embodiment of the present invention. First, a semiconductor substrate 21 having the structure shown in FIG. 6 is prepared. The main surface of semiconductor substrate 21 is classified into element forming region 22 and element isolating region 23. Element isolating region 23 has an isolating insulating film 24 of a thick oxide film, formed by thermal oxidation.

Then, as shown in FIG. 7, a mask layer 32 for preventing passage of an impurity is formed on the main surface of element forming region 22 which is surrounded by isolating insulating film 24. In this embodiment, a photoresist film is used as mask layer 32. By ion implanting an impurity with this state, an impurity layer 29 (the second impurity layer) is formed only immediately below isolating insulating film 24.

When an n channel MOS transistor is to be formed in element forming region 22, a p type impurity such as boron is used as the impurity to be implanted. The conditions for ion implantation must be so determined as to allow boron to pass through the isolating insulating film 24 to form the impurity layer 29 therebelow. Further, the thickness of mask layer 32 must be determined such that the impurity does not pass through mask layer 32 during ion implantation under thus determined conditions.

When the thickness of isolating insulating film 24 is 400 nm and ion implantation is performed with the energy of applied voltage of 150 keV and the dosage of $6 \times 10^{12}/cm^2$, the impurity concentration of second impurity layer 29 formed immediately below isolating insulating film 24 is about $3 \times 10^{17}/cm^3$. Further, the peak impurity concentration of second impurity layer 29 is positioned within the depth range of up to 0.1 µm from the lower surface of isolating insulating film 24. Passage of impurity can be prevented if the mask layer 32 has the thickness of about 2 µm.

Thereafter, mask layer 32 is removed, and then impurity (for example, boron) is ion-implanted through the main surface of element forming region and through isolating insulating film 24 as shown in FIG. 8, thus third and fourth impurity layers 30 and 31 are formed at positions deeper than second impurity layer 29. The conditions for ion implantation to form fourth impurity layer 31 are, for example, energy of application voltage of 700 keV and the dosage of $1 \times 10^{13}/cm^2$. When ion implantation is performed under such conditions, the impurity concentration of the formed fourth impurity layer 31 is about $5 \times 10^{17}/cm^3$. The depth of the peak impurity concentration from the main surface is positioned within the range of from 1.4 µm to 1.7 µm.

The conditions for ion implantation to form third impurity layer 30 are, for example, energy of applied voltage of 250 keV and the dosage of $2 \times 10^{12}/cm^2$. If ion implantation is performed under such conditions, the impurity concentration of the formed third impurity layer 30 is about $1 \times 10^{17}/cm^3$. The depth of the peak impurity concentration from the main surface is positioned within the range of from 0.7 µm to 0.8 µm.

Then, by ion implantation of boron, first impurity layer 28 is formed near the main surface of element forming region 22. At this time, since impurity is implanted only in the vicinity of the main surface of semiconductor substrate 2, impurity layer is not formed below isolating insulating film 24. The conditions for ion implantation to form first impurity layer 28 are, for example, the energy of applied voltage of 50 keV and the dosage of about $2 \times 10^{12}/cm^2$. When ion implantation is performed under such conditions, the impurity concentration of the formed first impurity layer 28 is about $1 \times 10^{17}/cm^3$. The depth of the peak impurity concentration from the main surface is positioned within the depth of up to 0.2 µm.

When a p channel MOS transistor is to be formed in the element forming region, an n type impurity such as phosphorus or arsenic is used instead of boron.

In the embodiment shown in FIGS. 1 to 8, the second impurity layer 29 for improving ability of isolation between elements and the third impurity layer 30 for adjusting substrate constant and junction capacitance are formed separate from each other through independent steps. Second impurity layer 29 is positioned only immediately below isolating insulating film 24, and it does not enter the element forming region 22. Therefore, even when impurity concentration of second impurity layer 29 is increased to improve the ability of isolating elements from each other, it does not affect the operational characteristics of the element formed in the element forming region.

Figure 9:
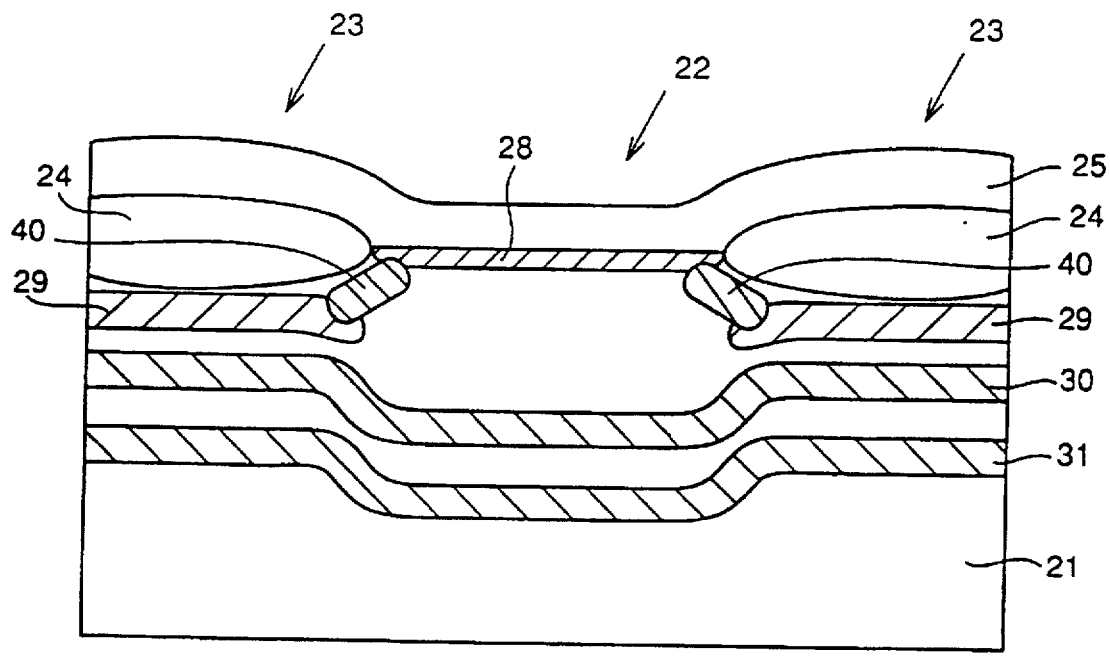
FIG. 9 is a cross section of a semiconductor substrate having a fifth impurity layer, in addition to four impurity layers.

FIG. 9 shows another embodiment of the present invention. In FIG. 9, the same or corresponding elements as in the above described embodiment are denoted by the same reference numerals. FIG. 9 corresponds to FIG. 2.

In the embodiment shown in FIG. 9, a fifth impurity layer 40 is formed near a portion immediately below the boundary between element forming region 22 and element isolating region 23 and overlapping a terminating portion of the second impurity layer 29. Fifth impurity layer 40 is to further improve the ability of isolating elements from each other. In the embodiment shown in the figure, fifth impurity layer 40 extends obliquely toward the main surface of element forming region 22.

In the embodiment shown in FIGS. 1 to 8, the impurity concentration near the edge of isolating insulating film 24 is low. Therefore, an inversion layer may possibly be formed at that portion during the operation of the transistor. Therefore, in the embodiment shown in FIG. 9, fifth impurity layer 40 is provided to prevent formation of such inversion layer during the operation of the transistor.

Figure 10:
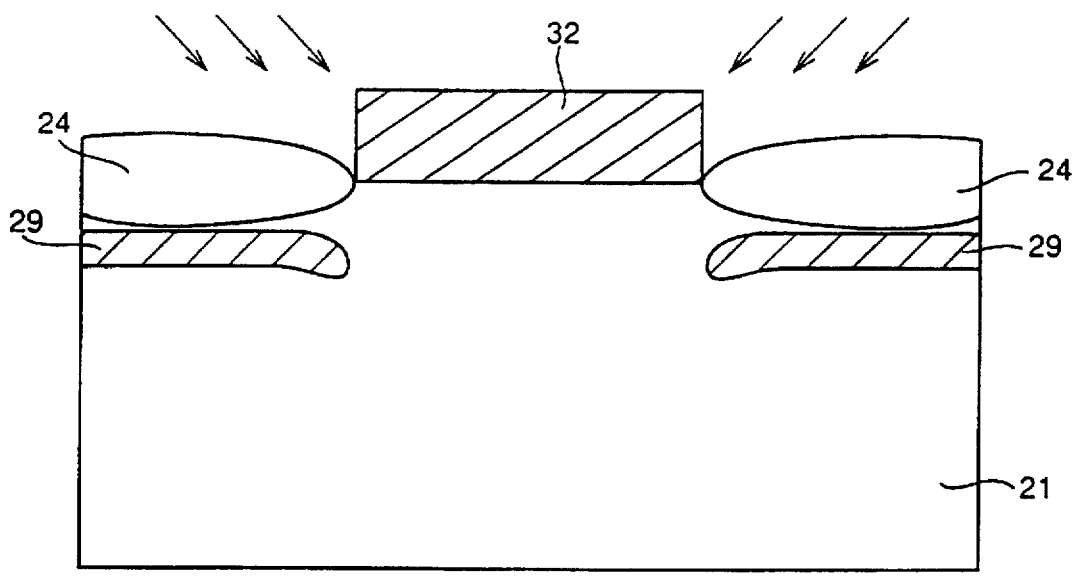
FIG. 10 is a cross section of a semiconductor device having an impurity layer immediately below the isolating insulating film only.
Figure 11:
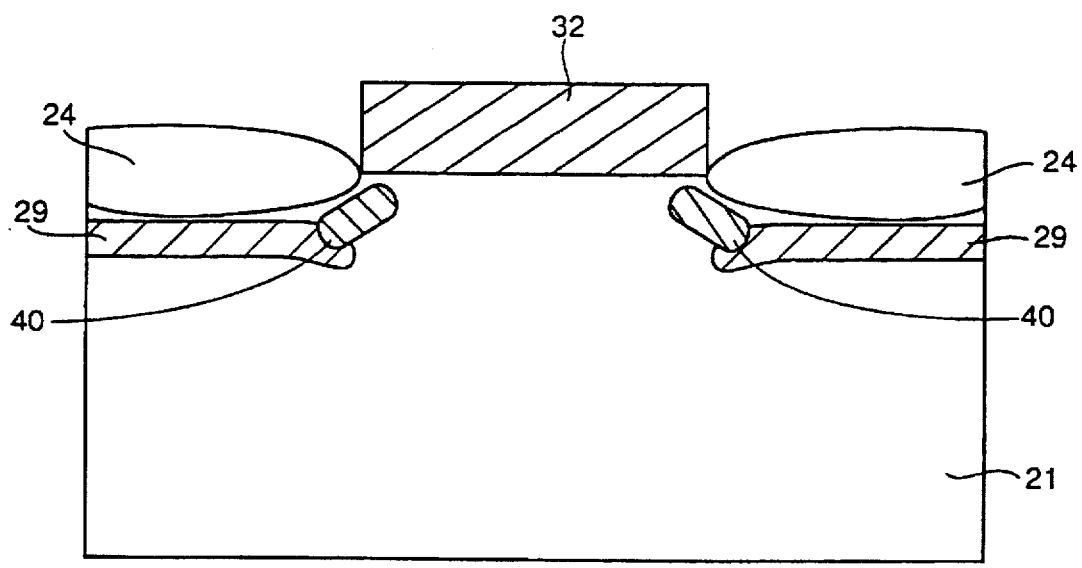
FIG. 11 is a cross section of a semiconductor substrate having an impurity layer at a boundary between an element forming region and an element isolating region.

FIGS. 10 and 11 show steps for forming fifth impurity layer 40. A second impurity layer 29 is formed by using mask layer 32, and then an impurity is obliquely ion-implanted to the surface of semiconductor substrate 21 with mask layer 32 left thereon, as shown in FIG. 10. By this ion implantation, fifth impurity layer 40 is formed as shown in FIG. 11. Conductivity type of fifth impurity layer 40 is the same as the first to fourth impurity layers 28, 29, 30 and 31. When an n channel MOS transistor is to be formed in the element forming region, boron is used, for example, as the impurity for forming fifth impurity layer 40. When isolating insulating film 24 has a thickness of 400 nm, conditions for ion implantation to form fifth impurity layer 40 are the energy of applied voltage of 90 keV and the dosage of about $2 \times 10^{12}/cm^2$.

After the fifth impurity layer 40 is formed, mask layer 32 is removed, and then ion implantation is performed to the entire main surface of semiconductor substrate 21, whereby first impurity layer 28, third impurity layer 30 and fourth impurity layer 31 are formed.

When a p channel MOS transistor is to be formed in the element forming region, an n type impurity such as phosphorus or arsenic is used as the impurity for forming fifth impurity layer 40.

Figure 12:
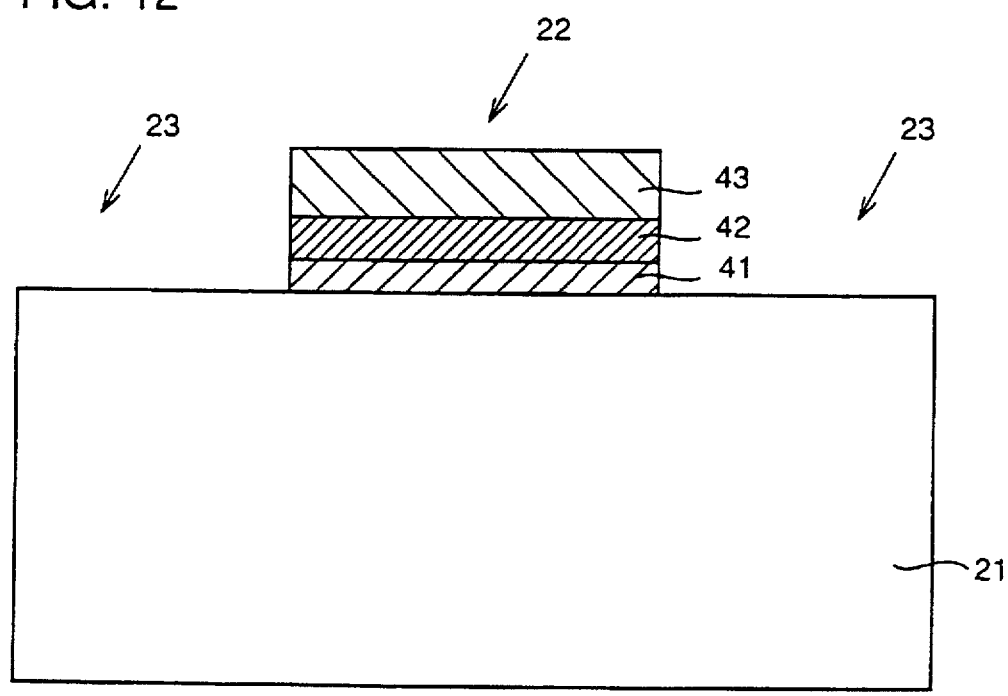
FIG. 12 is a cross section of a semiconductor substrate having an antioxidant film.
Figure 13:
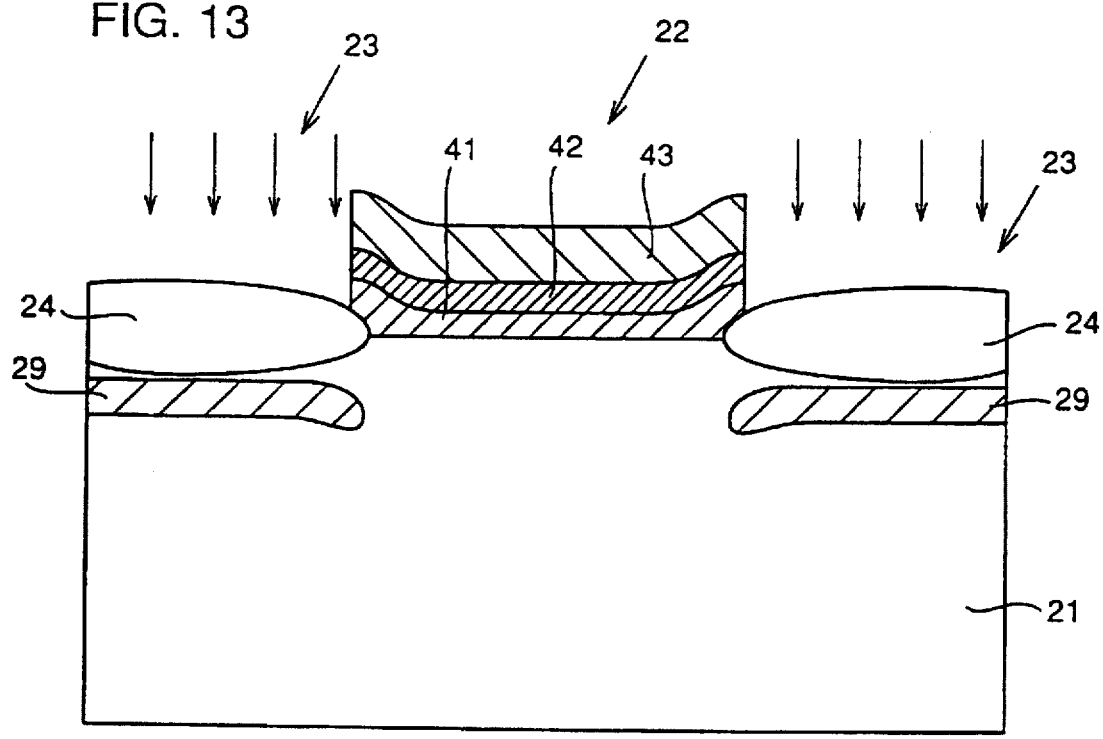
FIG. 13 is a cross section of a semiconductor substrate having an impurity layer immediately below the isolating insulating film only.
Figure 14:
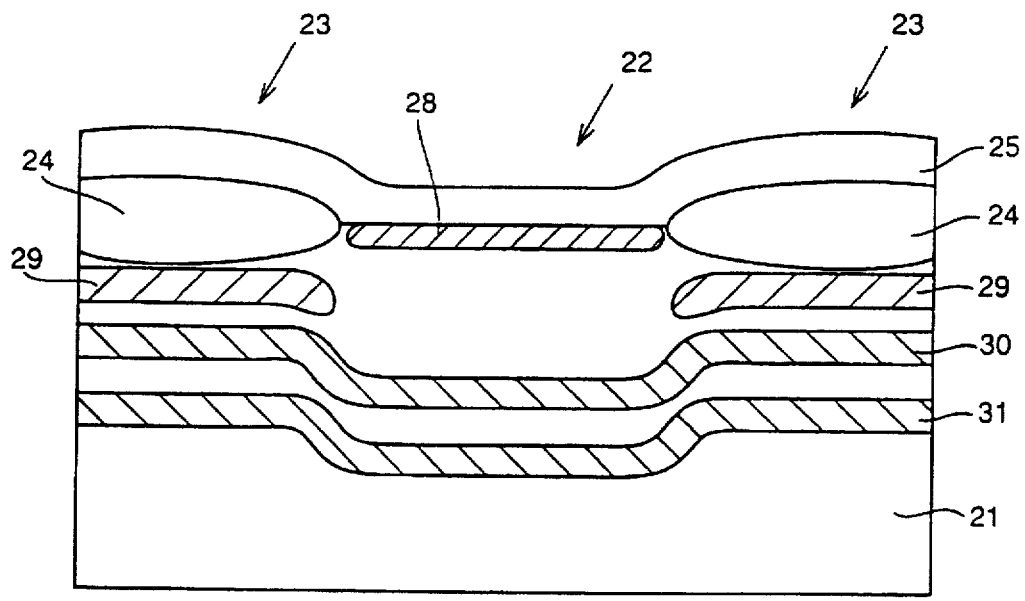
FIG. 14 is a cross section of a semiconductor substrate having four impurity layers.
Figure 15:
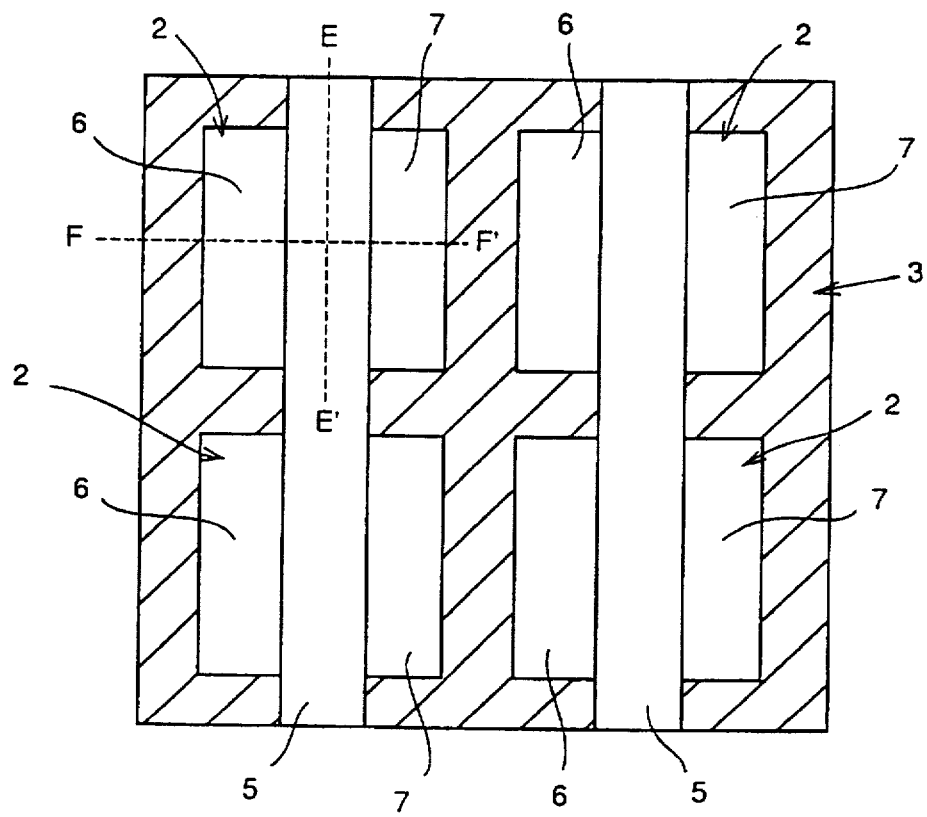
FIG. 15 is a plan view of a conventional semiconductor device.
Figure 16:
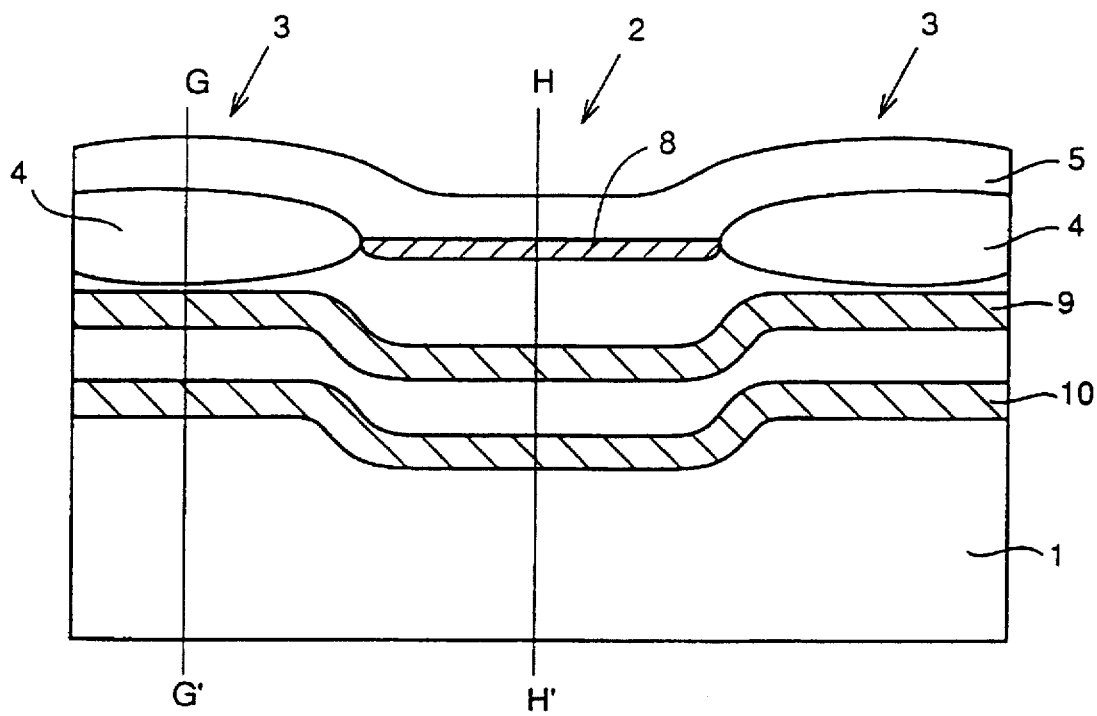
FIG. 16 is a cross section taken along the line E–E' of FIG. 15.
Figure 17:
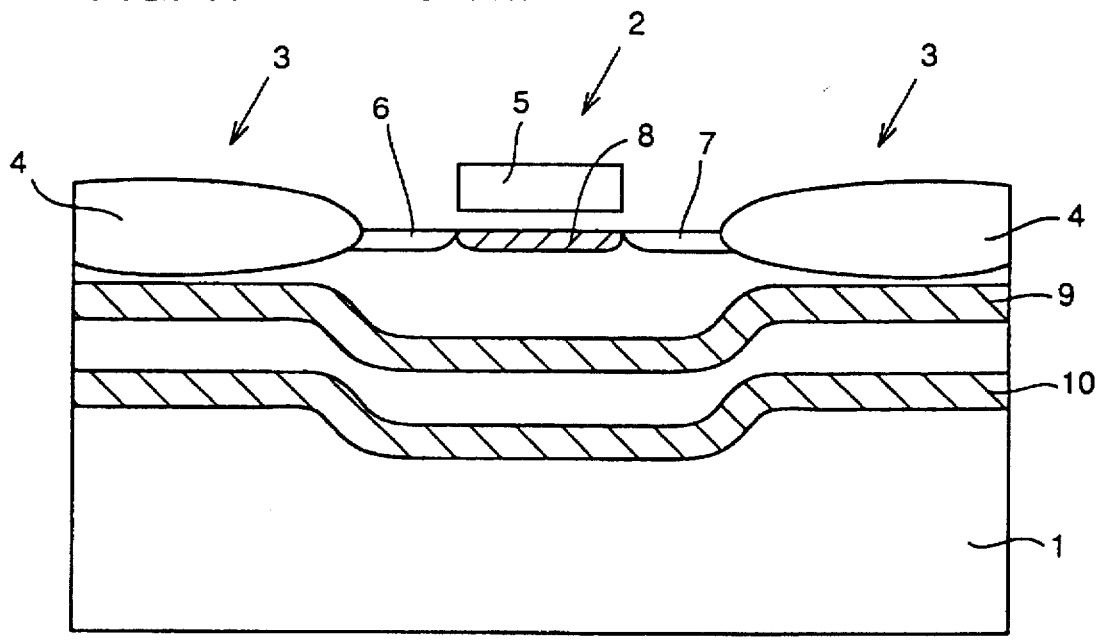
FIG. 17 is a cross section taken along the line F–F' of FIG. 15.
Figure 18:
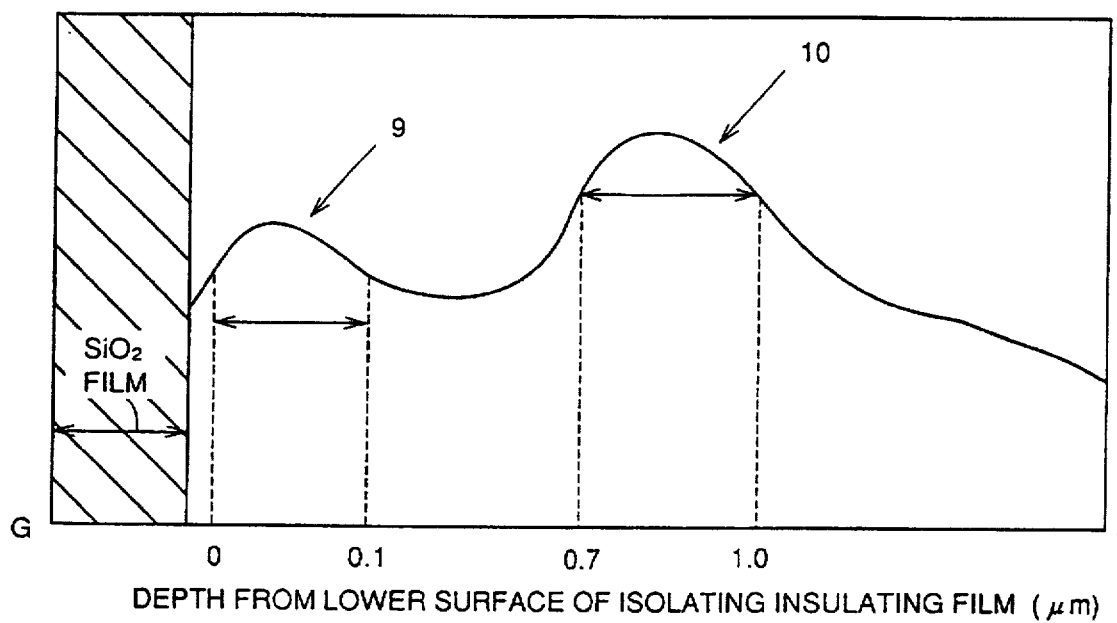
FIG. 18 shows a distribution curve of impurity concentration viewed along the line G–G' of FIG. 16.
Figure 19:
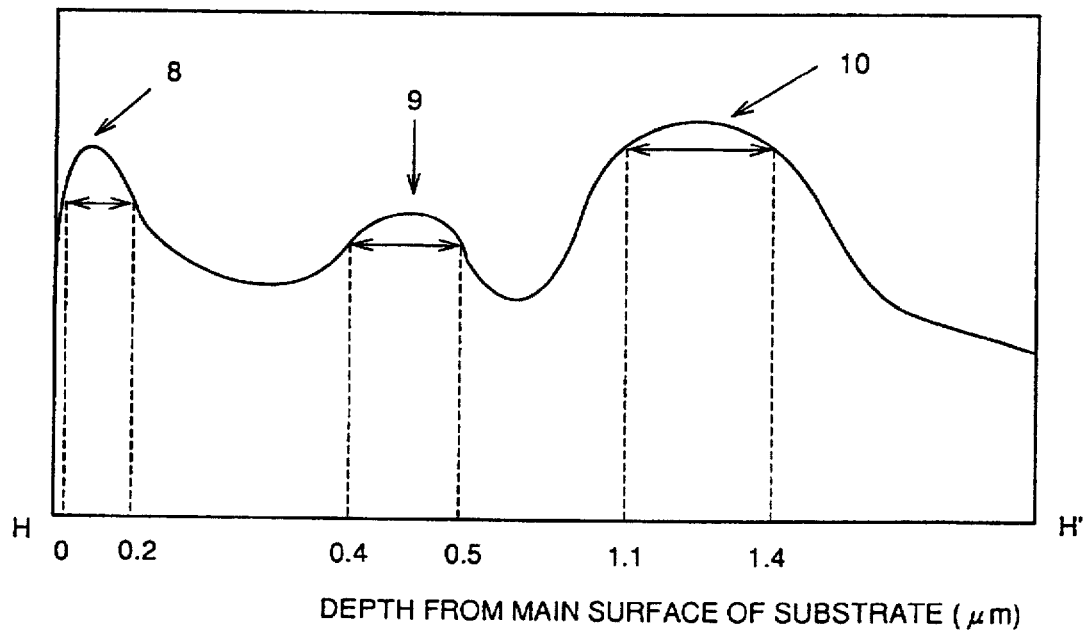
FIG. 19 shows a distribution curve of impurity concentration viewed along the line H–H' of FIG. 16.

FIGS. 12 to 14 show another example of the manufacturing method in accordance with the present invention. In these figures, the same or corresponding elements as in the above described embodiments are denoted by the same reference numerals.

As shown in FIG. 12, a laminated structure including a thin insulating film 41, a polycrystalline silicon film 42 and a thick nitride film 43 is formed on the main surface of element forming region 22. This laminated structure is formed by photolithography and anisotropic etching. For example, the thickness of thin insulating film 41 is 50 nm, the thickness of polycrystalline silicon film 42 is 100 nm and the thickness of thick nitride film 43 is 250 nm. This laminated structure serves as an antioxidant film.

As shown in FIG. 13, when semiconductor substrate 21 is thermally oxidized at a high temperature of 1100° C., an isolating insulating film 24 of an oxide film having the thickness of about 300 nm is formed in element isolating region 23. Then, the laminated structure including insulating film 41, polycrystalline silicon film 42 and nitride film 43 is used as a mask layer for ion implantation, an impurity is ion-implanted, and thus an impurity layer (second impurity layer) 29 is formed only immediately below isolating insulating film 24. The conditions for ion implantation at this time are, for example, the energy of applied voltage of 100 keV and the dosage of about $6 \times 10^{12}/cm^2$. When ion implantation is performed under such conditions, the impurity concentration of the formed second impurity layer 29 is about $3 \times 10^{17}/cm^3$. The peak impurity concentration is positioned in the depth range of up to 0.1 µm from the lower surface of isolating insulating film 24.

As in the above described embodiments, when an n channel MOS transistor is to be formed in the element forming region, boron or the like is used as the impurity for forming second impurity layer 29. When a p channel MOS transistor is to be formed, an n type impurity such as phosphorus or arsenic is used instead of boron.

After the formation of second impurity layer 29, the laminated structure including insulating film 41, polycrystalline silicon film 42 and nitride film 43 is removed, and an impurity is ion-implanted to the entire main surface of semiconductor substrate 21, so as to form the first, third and fourth impurity layers 28, 30 and 31 as shown in FIG. 14.

If the fifth impurity 40 such as shown in FIG. 9 is to be formed, an impurity may be obliquely ion-implanted in the state of FIG. 13.

As described above, according to the present invention, the impurity layer for improving ability of isolation between elements and the impurity layer for adjusting substrate constant and junction capacitance are formed separate from each other through independent steps, and therefore the ability for isolating elements from each other can be improved while increase in substrate constant and in junction capacitance can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming an isolating insulating film for isolating elements from each other on a main surface of a semiconductor substrate;

forming a mask layer for preventing passage of an impurity, on a main surface of an element forming region surrounded by said isolating insulating film;

forming a first impurity layer only immediately below said isolating insulating film, by ion-implanting an impurity through said isolating insulating film on the main surface of semiconductor substrate having said mask layer;

forming a second impurity layer at a position deeper than said first impurity layer, by ion-implanting an impurity, after removal of said mask layer, through the main surface of said element forming region and through said isolating insulating film;

forming a third impurity layer at a position deeper than said second impurity layer by ion-implanting an impurity through the main surface of said element forming region and through said isolating insulating film; and forming a fourth impurity layer at a position near the main surface of said element forming region but not below said isolating insulating film.

2. The method of manufacturing a semiconductor device according to claim 1, wherein said first impurity layer is formed to improve ability for isolating elements from each other, and said second impurity layer is formed to adjust substrate constant and junction capacitance.

3. The method of manufacturing a semiconductor device according to claim 2, wherein said first impurity layer has peak impurity concentration in a depth range of up to 0.1 µm from a lower surface of said isolating insulating film, and said second impurity layer has peak impurity concentration in a depth range of from 0.7 µm to 0.8 µm from the main surface of said element forming region.

4. The method of manufacturing a semiconductor device according to claim 3, wherein said second impurity layer extends to a region positioned below said first impurity layer, and said second impurity layer has peak impurity concentration in a depth range of from 0.3 µm to 0.4 µm from the lower surface of said isolating insulating film.

5. The method of manufacturing a semiconductor device according to claim 1, further comprising the steps of forming a fifth impurity layer partially overlapping with a terminating portion of said first impurity layer and extending obliquely toward the main surface of said element forming region, by oblique ion implantation of an impurity to the main surface of said semiconductor substrate, with said mask layer left thereon.

6. The method of manufacturing a semiconductor device according to claim 5, wherein said fifth impurity layer is formed to improve ability for isolating elements from each other.

7. The method of manufacturing a semiconductor device according to claim 1, wherein said isolating insulating film is an oxide film formed by thermal oxidation, and an antioxidant film formed to cover the main surface of said element forming region prior to the formation of said isolating insulating film is used as said mask layer.

8. The method of manufacturing a semiconductor device according to claim 1, wherein peak value of impurity concentration of said second impurity layer is smaller than peak value of impurity concentration of said first impurity layer.

* * * * *